(12) United States Patent
Schleicher

(10) Patent No.: US 6,362,646 B1
(45) Date of Patent: *Mar. 26, 2002

(54) METHOD AND APPARATUS FOR REDUCING MEMORY RESOURCES IN A PROGRAMMABLE LOGIC DEVICE

(75) Inventor: James Schleicher, Sunnyvale, CA (US)

(73) Assignee: Altera Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/016,544

(22) Filed: Jan. 30, 1998

Related U.S. Application Data

(60) Provisional application No. 60/065,329, filed on Nov. 13, 1997, and provisional application No. 60/050,329, filed on Jun. 20, 1997.

(51) Int. Cl.[7] ............... H03K 19/177; H03K 19/173
(52) U.S. Cl. ............... 326/40; 326/41; 326/47
(58) Field of Search ............... 326/38, 39, 41, 326/47

(56) References Cited

U.S. PATENT DOCUMENTS

| | | | |
|---|---|---|---|
| RE34,363 E | | 8/1993 | Freeman |
| 5,327,023 A | * | 7/1994 | Kawana et al. ............... 326/39 |
| 5,436,576 A | * | 7/1995 | Hibdon et al. ............... 326/47 |
| 5,550,782 A | | 8/1996 | Cliff et al. |
| 5,804,986 A | * | 9/1998 | Jones ............... 326/40 |
| 5,874,834 A | * | 2/1999 | New ............... 326/39 |
| 5,880,597 A | * | 3/1999 | Lee ............... 326/41 |

OTHER PUBLICATIONS

Bursky, Dave, "Combination RAM/PLD Opens New Application Options", Electronic Design, pp. 138–140, May 23, 1991.

Intel Corporation "10 ns FLEXlogic FPGA with SRAM Option", Intel®, iFX780, pp. 2–24 –2–46, Nov. 1993.

NGAI, Tony Kai–Kit, "An SRAM–Programmable Field–Reconfigurable Memory", Department of Electrical Engineering, University of Toronto, Thesis for Master of Applied Science, 1994.

* cited by examiner

*Primary Examiner*—Michael Tokar
*Assistant Examiner*—James A. Cho
(74) *Attorney, Agent, or Firm*—Beyer Weaver & Thomas LLP

(57) ABSTRACT

The invention relates to a method and an apparatus for reducing memory resources in an integrated circuit. Typically, the integrated circuit chip is a complex programmable logic device architecture (CPLD). The integrated circuit includes a plurality of interconnection lines as well as a first type function block capable of being programmed to operate in a first plurality of modes. The first type function block includes a first plurality of function block Input/Output (I/O) lines. The integrated circuitry also includes a second type function block capable of being programmed to operate in a second plurality of modes. The second type function block includes a second plurality of function block Input/Output (I/O) lines. The integrated circuit includes a shared programmable interface array device operatively connected to the first and second type function blocks. The shared programmable interface array device programmably interconnects the interconnection lines to the function block I/O lines of the first and second type function blocks.

7 Claims, 7 Drawing Sheets

METHOD AND APPARATUS FOR REDUCING MEMORY RESOURCES IN A PROGRAMMABLE LOGIC DEVICE

CROSS REFERENCE TO RELATED APPLICATIONS

This application claims benefit of priority under 35 U.S.C. 119(e) of (i) U.S. Provisional Application No. 60/065,329 (Att. Dkt. No. ALTRP035+), filed Nov. 13, 1997 and entitled "Programmable Logic Device Incorporating an Interleaved Embedded Array Block Programmable Interface Array," and (ii) U.S. Provisional Application No. 60/050,329, filed Jun. 20, 1997 and entitled "Embedded Array Block with Split Programmable Interconnect Array and Shared Input Muxes in a Programmable Logic Device." This application is also related to U.S. application Ser. No. 09/016,209(Att. Dkt. No. ALTRP029), filed concurrently herewith, and entitled "Programmable Logic Device Incorporating a Memory Efficient Interconnection Device", which is hereby incorporated by reference.

BACKGROUND OF THE INVENTION

1. Field of the Invention

The present invention generally relates to programmable logic devices. More specifically, the present invention relates to interconnecting logic and memory elements included within programmable logic devices.

2. Description of the Related Art

A programmable logic device (PLD) is a programmable integrated circuit that allows a user of the circuit, using software control, to program particular logic functions the circuit will perform. Logic functions performed by small, medium, and large-scale integrated circuits can instead be performed by programmable logic devices (PLDS). When an integrated circuit manufacturer supplies a typical PLD, it is not yet capable of performing any specific function. The user, in conjunction with software supplied by the manufacturer or created by the user or an affiliated source, can program the PLD to perform particular functions required by the user's application. The PLD then can function in a larger system designed by the user just as though dedicated logic chips were employed. For the purpose of this description, it should be understood that a programmable logic device refers to once programmable devices as well as reprogrammable devices.

Programmable logic encompasses all digital logic circuits that are configured by the end user, including PLDs, field programmable gate arrays (FPGAs) and complex programmable logic devices (CPLDs). The general architecture of the embedded array programmable logic design will be generally familiar to those knowledgeable of the FLEX10K™ logic family of devices manufactured by the Altera Corporation of San Jose, Calif. Such an architecture, for example, is described in U.S. Pat. No. 5,550,782 and Altera Data Book 1996, both of which are incorporated herein by reference.

Referring to FIG. 1, a CPLD 100 with a conventional embedded array programmable logic design will be described. Although only a few logic array blocks or memory blocks are illustrated in FIG. 1, it should be appreciated that any number may be provided in order to meet the needs of a particular system.

The CPLD 100 includes a core region 102 that couples to vertical bi-directional ports 104 and horizontal bidirectional ports 106 included within a peripheral region 108. The core region 102 includes a plurality of logic array blocks (LABs) 110 and a plurality of embedded array blocks (EABs) 112. Each EAB 112 includes an array of memory elements. Each LAB 110 includes a plurality of logic elements (LE) which are capable of performing simple logic functions. An internal logic interconnect included within each LAB serves to interconnect each of the logic elements included therein.

As shown in FIG. 1, the plurality of LABs 110 and the plurality of EABs 112 are programmably interconnected by way of global horizontal conductors 114 and global vertical conductors 116 to form a logic and memory array. The global horizontal conductors 114 couple to the horizontal ports 106 and the global vertical conductors 116 couple to the vertical ports 104.

Additional details of the CPLD 100 are explained with reference to a representative portion 118 of the core region 102 illustrated in FIG. 1. In the representative portion 118, the global horizontal conductor 114-1 is coupled to EAB 112-1 by way of a plurality of local vertical conductors 120 and a plurality of local horizontal conductors 122. The local vertical conductors 120 are programmably coupled to the global horizontal conductor 114-1 by way of a programmable interconnect array (PIA) 124. The local vertical conductors 120 are also programmably coupled to the local horizontal conductors 122 by way of a programmable interconnect region 126. The local horizontal conductors 122 in turn couple to the EAB 112-1.

Also, within the representative portion 118, the global horizontal conductor 114-1 is coupled to LAB 110-1 by way of a plurality of local vertical conductors 128 and a plurality of local horizontal conductors 130. The local vertical conductors 128 are programmably coupled to the global horizontal conductor 114-1 by way of a programmable interconnect array (PIA) 132. The local vertical conductors 128 are also programmably coupled to the local horizontal conductors 130 by way of a programmable interconnect region 134. The local horizontal conductors 130 in turn couple to the LAB 110-1.

In the conventional CPLD 100 architecture, fitting a desired logic function requires various logic elements included in the LAB 110 and/or memory blocks included in the EAB 112 to be individually configured to perform a small but crucial part of the overall logic and/or memory function. Any automatic routing and placing software must then logically connect all the programmed logic elements and/or memory elements such that CPLD 100 can execute the desired logic function and or memory-logic function. Unfortunately, the level of complexity with which the LAB 110 and/or the EAB 112 are to be programmed in order to fit the desired logic function can only be determined when the logic function and/or memory function to be fitted is known. Therefore, in order to have a high probability of successfully fitting a desired logic function and/or memory function, the programmable interconnect array 132 and the programmable interconnect array 124 must each be capable of supplying sufficiently large number I/O signal lines in the form of local vertical conductors so as to be able to support the most complex configurations of the LAB 110-1 and the EAB 112-1.

However, most logic functions and/or memory functions do not require the most complex configurations for both the LAB 110 and the EAB 112 in order to be successfully fitted within the CPLD 100. Therefore, because the programmable interconnect array 132 and the programmable interconnect array 124 are designed to handle worse case conditions, the programmable interconnect arrays 124 and 132 typically include far more programming resources in the form of programmable connectors than is needed to successfully fit a logic function. This results in inefficient use of programming resources which unnecessarily increases the quantity of memory cells 162 required to fit complex logic functions.

By way of example, the LAB 110-1 is capable of being programmed to perform a logic function that requires, for example, a quantity M of I/O signals carried by a quantity M of local horizontal conductors 130. Each of the quantity M of local horizontal conductors 130 in turn must be capable of carrying a separate I/O signal that originates from an associated one of a quantity N of row channels included in the global horizontal conductor 114-1, for example. Therefore, the quantity M of local horizontal conductors 130 requires a quantity M of local vertical conductors 128 each having at least an associated quantity N of programmable connectors.

In a similar fashion, the EAB 112-1 is capable of being programmed to perform a logic/memory function that requires, for example, a quantity of R I/O signals carried by a quantity R of local horizontal conductors 122. Each of the quantity of R local horizontal conductors 122 in turn must be capable of carrying a separate I/O signal that originates from an associated one of a quantity N of row channels included in the global horizontal conductor 114-1, for example. Therefore, the quantity R of local horizontal conductors 122 requires a quantity R of local vertical conductors each having at least an associated quantity N of programmable connectors.

Therefore, if the CPLD 100 includes a quantity $\mu_1$ of LABs 110 and a quantity $\mu_2$ of EABs 112, a quantity T of memory cells 162 need is determined by the following equation, $$T=(\mu_1 \times M \times N)+(\mu_2 \times R \times N).$$

Hence, the amount of memory cells 162 that must be necessarily included in the CPLD 100 in order to assure a high probability of fitting a complex logic function is large. This large quantity T of memory cells 162 consumes large amounts of valuable die area and thus reduces the number of logic and memory elements that may be included in the CPLD 100. Therefore, having the large quantity T of memory cells 162 to improve the fitting probability for complex logic functions actually results in reducing the probability of fitting a desired complex logic function due to the commensurate reduction in the number of available logic and memory elements in the CPLD 100.

In view of the foregoing, it is advantageous and therefore desirable to have available a programmable logic device which is capable of reducing the quantity of memory cells needed to fit the desired logic function and/or memory function in a CPLD while still maintaining a high probability of fitting a desired complex function.

SUMMARY OF THE INVENTION

Broadly speaking, the invention relates to an integrated circuit that incorporates interconnect regions (areas) capable of sharing a reduced set of signal lines between function blocks. Typically, the integrated circuit chip is a complex programmable logic device architecture (CPLD). By sharing the reduced set of signal lines amongst function blocks, the invention is able to reduce the quantity of memory resources required to interconnect the function blocks while at the same time not substantially sacrificing the probability of fitting logic functions in the CPLD. The reduction in memory resources that the CPLD must provide leads to increased availability of precious die area for other components of the CPLD.

In one embodiment of the invention, an integrated circuit includes a plurality of interconnection lines as well as a first type function block capable of being programmed to operate in a first plurality of modes. The first type function block includes a first plurality of function block Input/Output (I/O) lines. The integrated circuitry also includes a second type function block capable of being programmed to operate in a second plurality of modes. The second type function block includes a second plurality of function block Input/Output (I/O) lines. The integrated circuit includes a shared programmable interface array device operatively connected to the first and second type function blocks. The shared programmable interface array device programmably interconnects the interconnection lines to the function block 110 lines of the first and second type function blocks.

In another embodiment of the invention, a method of interconnecting function blocks of a programmable logic device to assist in fitting a logic function in the programmable logic device is disclosed. The programmable logic device includes bi-directional ports, interconnection lines, programmable connectors, I/O signal lines, and memory resources for controlling the programmable connectors. The method includes the following operations. First, selected ones of the function blocks within the programmable logic device are programmed to perform at least a subpart of the logic function to be fitted.

Next, the average quantity of the I/O signal lines needed by the programmed function blocks is determined followed by identifying certain ones of the programmed function blocks that require more than the average quantity of I/O signal lines. Next, certain other ones of the programmed function blocks that require less than then average quantity of I/O signal lines are identified. The certain ones of the programmed function blocks are then associated with the certain other ones of the programmed function blocks. Finally, at least the associated programmed function blocks are interconnected with the interconnection lines by way of the programmable connectors as controlled by the memory resources.

In still another embodiment of the invention, a programmable logic device is disclosed. The programmable logic device includes a plurality of interconnection lines each having a plurality of interconnect programmable connectors, a first programmable function block operable in a first plurality of modes, and a first plurality of programmable conductors each having an associated first plurality of programmable connectors. The programmable logic device also includes a second programmable function block operable in a second plurality of modes as well as a second plurality of programmable conductors each having an associated second plurality of programmable connectors. The second plurality of programmable conductors are spatially interleaved in relation to the first plurality of programmable conductors.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

DETAILED DESCRIPTION OF THE INVENTION

The invention relates to an integrated circuit that incorporates interconnect regions (areas) capable of dynamically sharing signal lines between function blocks. Typically, the integrated circuit chip is a complex programmable logic device (CPLD) architecture. By dynamically sharing signal lines amongst function blocks, the invention is able to reduce the quantity of memory resources required to programmably interconnect the function block while at the same time not substantially sacrificing the probability of fitting logic functions in the CPLD. In one embodiment, the memory resources are reduced while fitting a logic and/or a memory function by a function block programmed to perform complex logic and/or memory functions sharing signal lines with unprogrammed function blocks or function blocks programmed to perform simple logic and/or memory functions. In this manner, the number of signal lines and associated memory resources required to fit a logic function can be reduced from that which would conventionally be required. The reduction in memory resources that the CPLD must provide leads to availability of precious die area for other components of the CPLD.

In the following description, numerous specific details are set forth in order to provide a thorough understanding of the invention. It will be apparent, however, to one skilled in the art that the invention may be practiced without some or all of these specific details. In other instances, well known structures or operations have not been described in detail in order to not unnecessarily obscure the invention.

Figure 1:
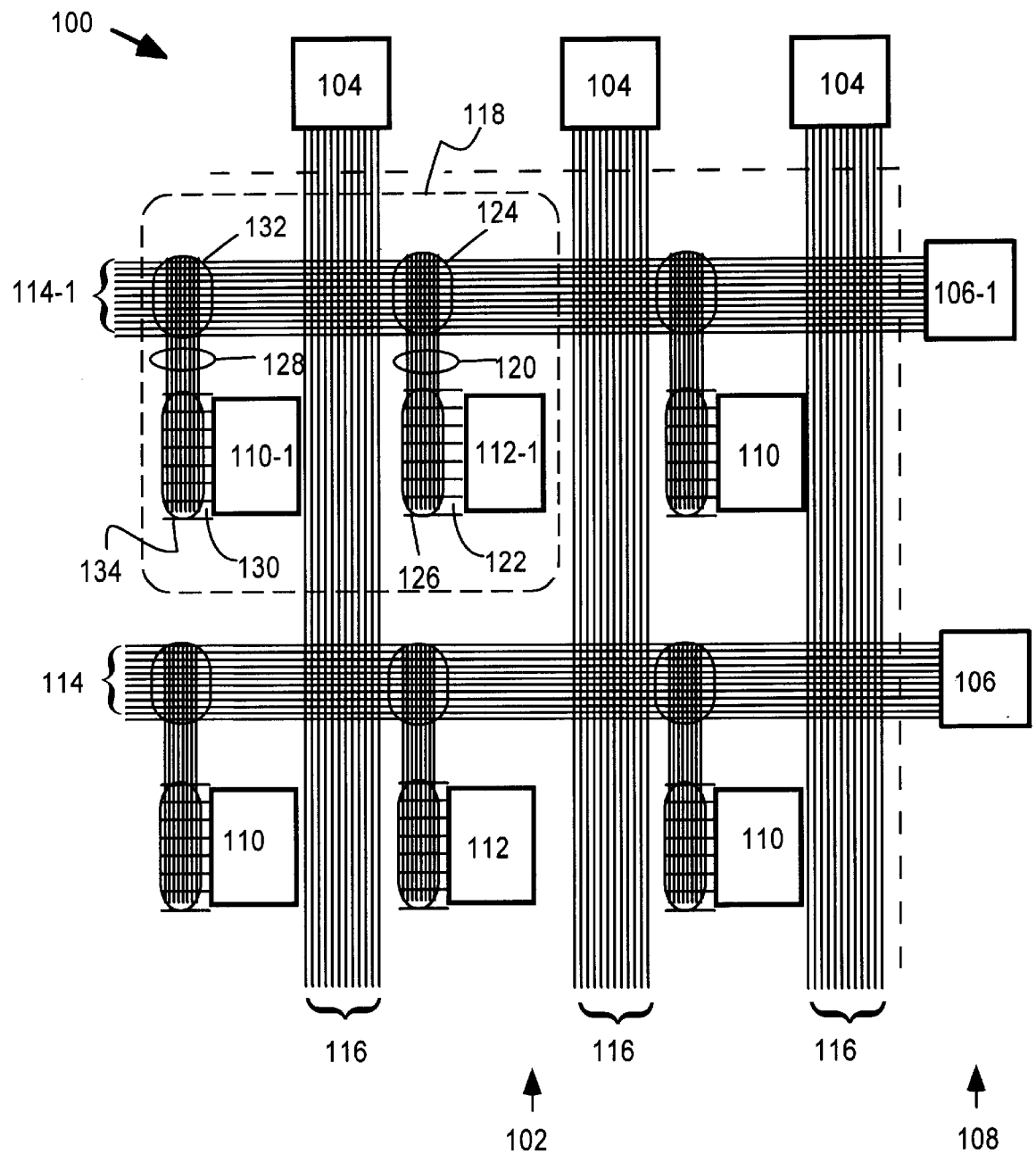
FIG. 1 is a block diagram of a conventional embedded array type complex programmable logic device architecture.
Figure 1A:
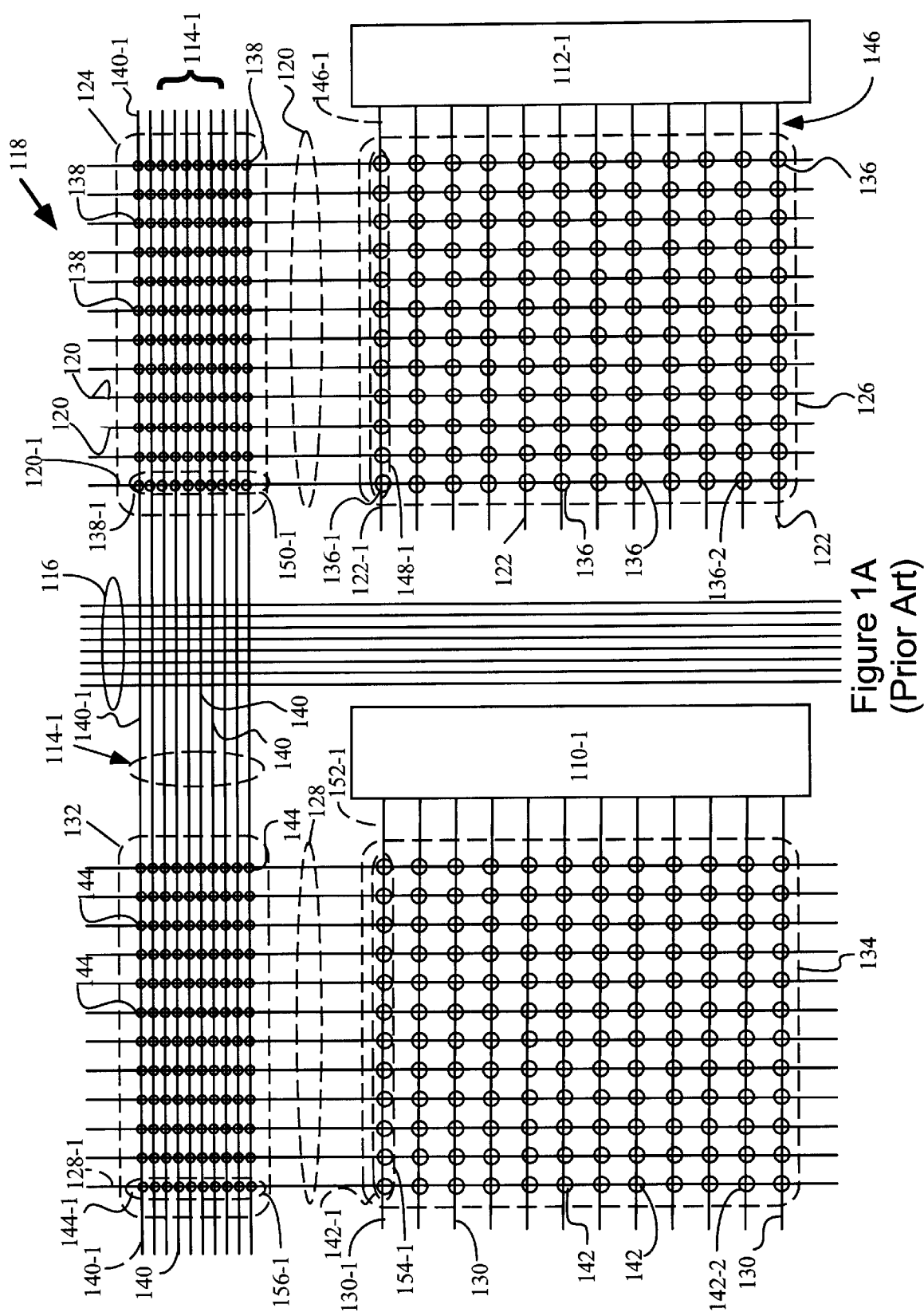
FIG. 1A is a schematic diagram of a representative portion of the conventional embedded array type complex programmable logic device as shown in FIG. 1
Figure 1B:
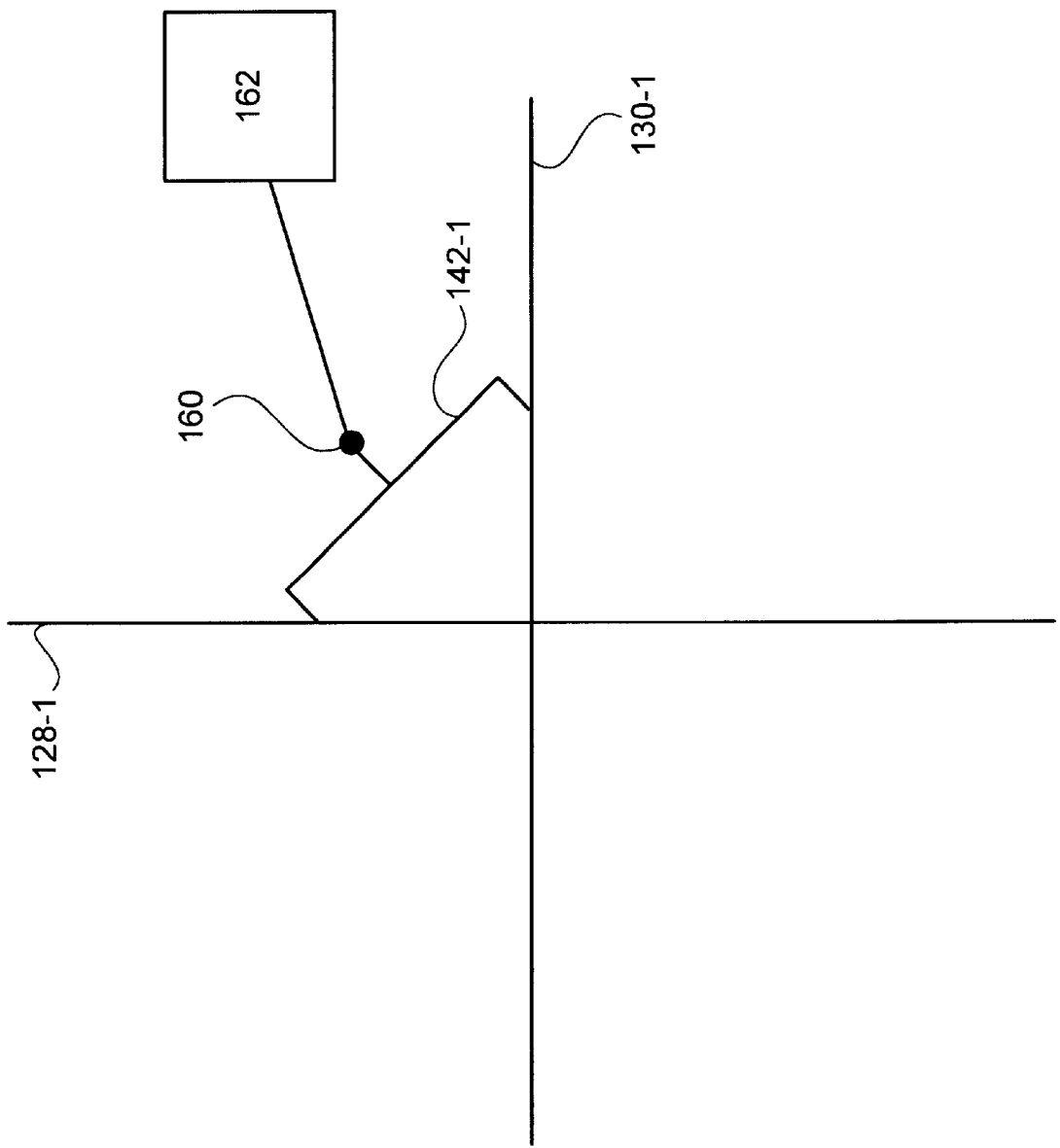
—and—FIG. 1B is a conventional programmable interconnect array using memory cells.
Figure 2:
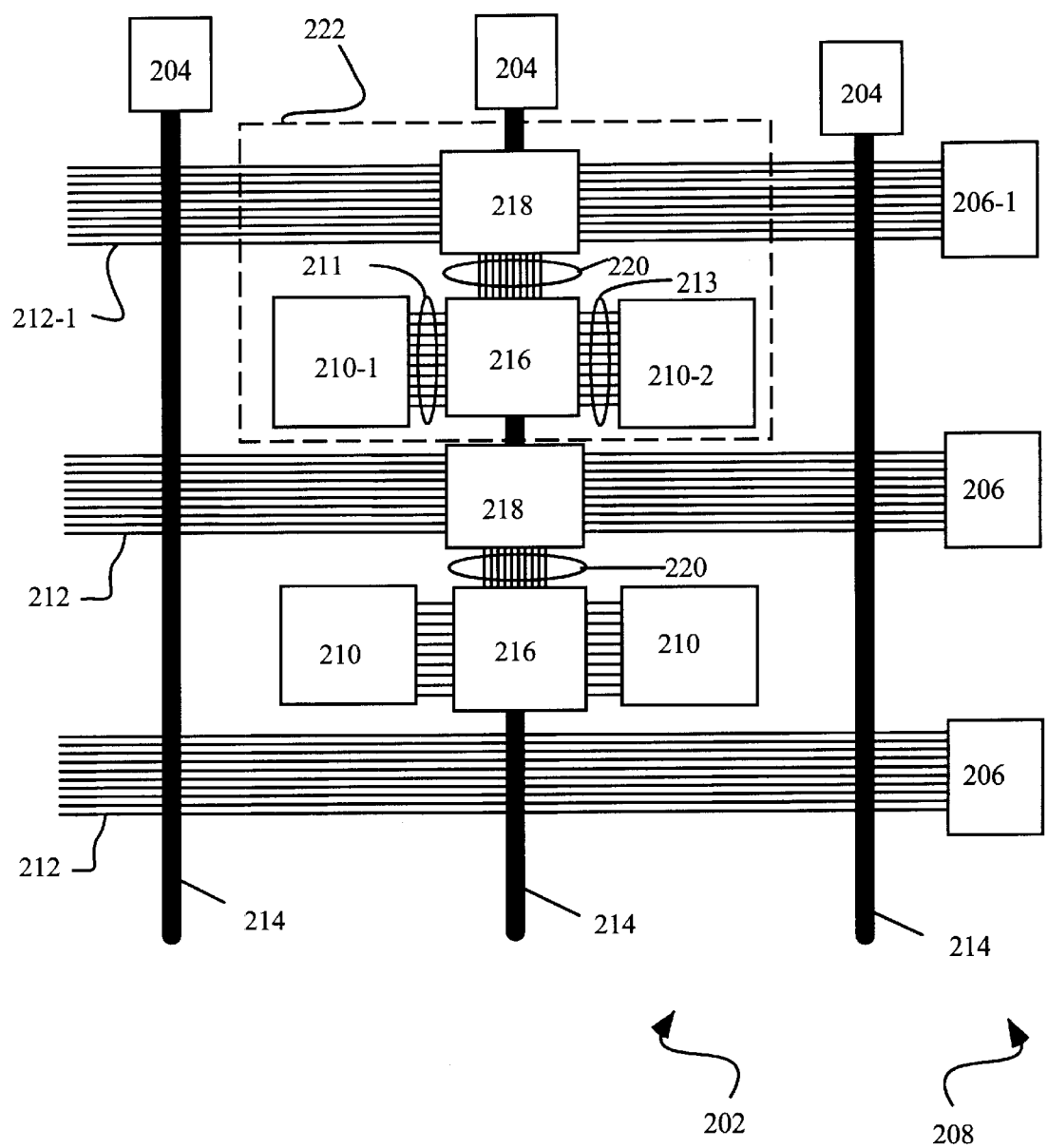
FIG. 2 is a block diagram of a complex programmable logic device incorporating an interconnect region capable of dynamically sharing signal lines amongst function blocks in accordance with an embodiment of the invention.

FIG. 2 is a block diagram of a CPLD 200 incorporating an interconnect region functional blocks capable of dynamically sharing signal lines amongst function blocks in accordance with an embodiment of the invention. The CPLD 200 is a particular type of integrated circuit that is well suited for use with the invention. The CPLD 200 includes a core region 202 coupled to a plurality of vertical bidirectional ports 204 and a plurality of horizontal bi-directional ports 206 included within a peripheral region 208. The core region 202 includes the function blocks 210. The function block 210 receives functional block I/O lines 211 capable of passing data signals and control signals between the function block 210 and any external circuit connected thereto. In the described embodiment, the function block 210 can operate in a mode deemed suitable for fitting a desired logic function. By way or example, the function block 210 can take the form of a logic array block (LAB) or the function block 210 can take the form of an embedded array block (EAB). Although only a few of the function blocks 210 are illustrated in FIG. 2, it should be appreciated that any number may be provided in order to meet the needs of a particular system.

The functional blocks 210 are programmably connected to a plurality of global horizontal conductors 212 and a plurality of global vertical conductors 214 to implement logical circuits within the CPLD 200. The horizontal bi-directional port 206-1 can be selectively coupled to the global horizontal conductor 212-1 (and all row channels included therein) so that core region 202 may communicate with external circuitry connected to the horizontal bi-directional port 206-1. Such external circuitry may, for example, include systems such as personal or work station computers. Such systems being capable of executing automatic place and route software such as, for example, MAX+ PLUS II™ developed by the Altera Corporation of San Jose, Calif. In a procedure referred in the art as fitting a logic function, such automatic place and route software is used to logically couple previously programmed logic and memory units (e.g., function blocks 210) included within core region 202 by programming various programmable connectors. In this manner, the CPLD 200 is programmed to perform the logic function as desired.

According to the invention, the function block 210-1 and the function block 210-2 are connected to a shared programmable interconnect region 216 by way of function block I/O lines 211 and function block I/O lines 213, respectively. The shared programmable interconnect region 216 is in turn connected to a programmable interconnect array 218 by way of local vertical conductors 220. The shared programmable interconnect array 218 in turn connects the local vertical conductors 220 to the global horizontal conductor 212-1. In this way, the function block 210-1 and the function block 210-2 can communicate with any other of the function blocks 210 included in the CPLD 200. The function block 210-1 and the function block 210-2 can also communicate with any external circuitry by way of the horizontal bidirectional ports 206 or the vertical bi-directional ports 204. For example, the function block 210-1 and the function block 210-2 can connect to the horizontal bi-directional port 206-1 via the global horizontal conductor 212-1.

Figure 3:
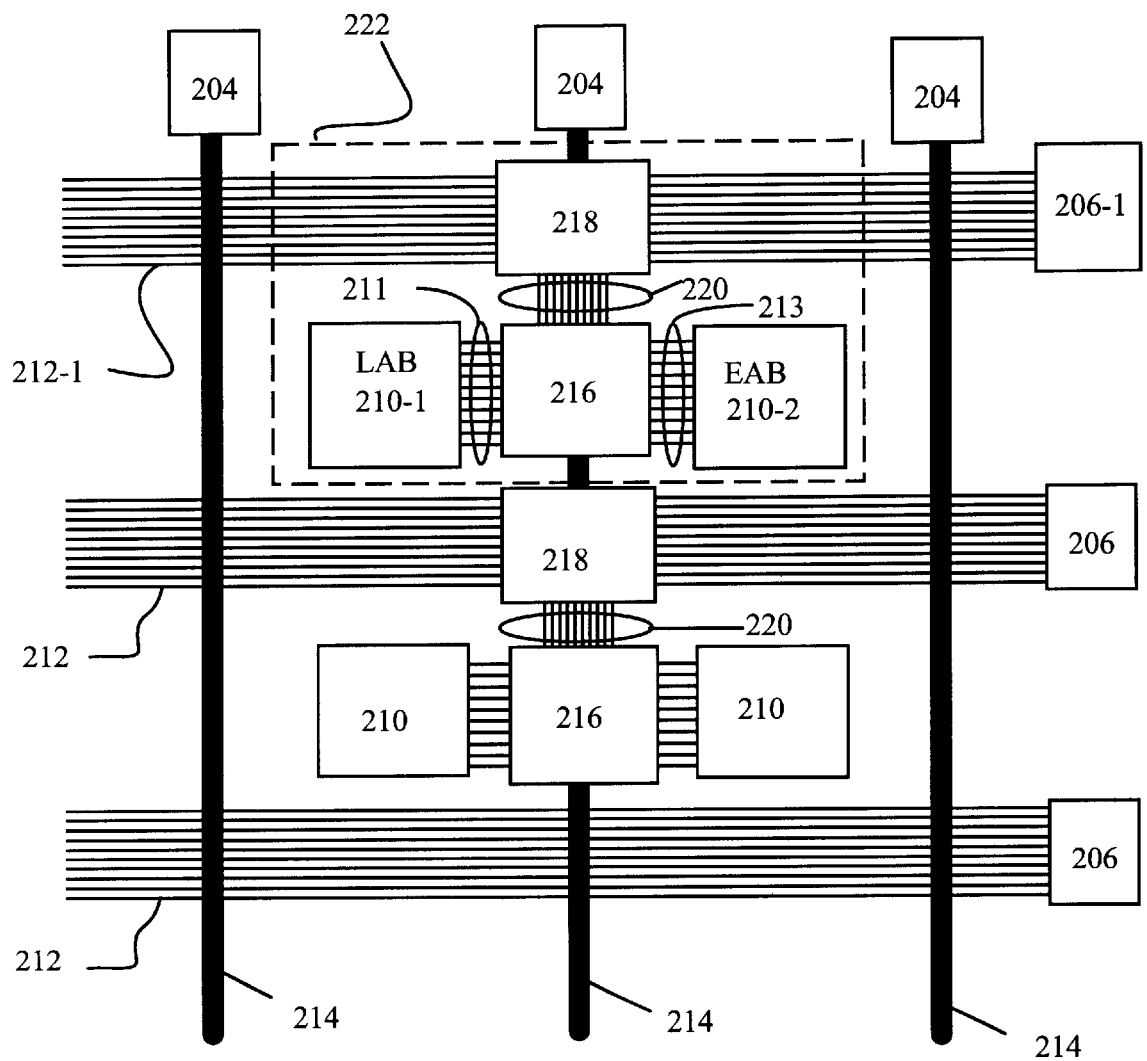
FIG. 3 is a block diagram of the complex programmable logic device as shown in FIG. 2 where the function blocks operate as logic array blocks or embedded array blocks.

Although not required, the function block 210 can be configured in many operational modes as deemed suited for a desired application. In one embodiment the function block 210 can be a logic array block (LAB) or an embedded array block (EAB) which operates in more than one operational mode. FIG. 3 is a block diagram of the CPLD 200 as shown in FIG. 2 where the function blocks operate as LABs or EABs. More particularly, in this embodiment of the invention, the function block 210-1 takes the form of an LAB while the function block 210-2 takes the form of an EAB. A representative portion 222 includes the LAB 210-1 and the EAB 210-2. It should be noted that although the global vertical conductors 214 are represented as a solid line for sake of clarity the global vertical conductors 214 include a plurality of separate conductors. In order to fit a desired logic function, various logic elements included in the LAB 210-1 and/or memory elements included in the EAB 210-2 can be individually programmed to perform a small but crucial part of the overall logic and/or memory function. Any automatic routing and placing software must then logically connect all the programmed logic elements and/or memory elements such that CPLD 200 may execute the desired logic function and or memory-logic function.

Figure 4:
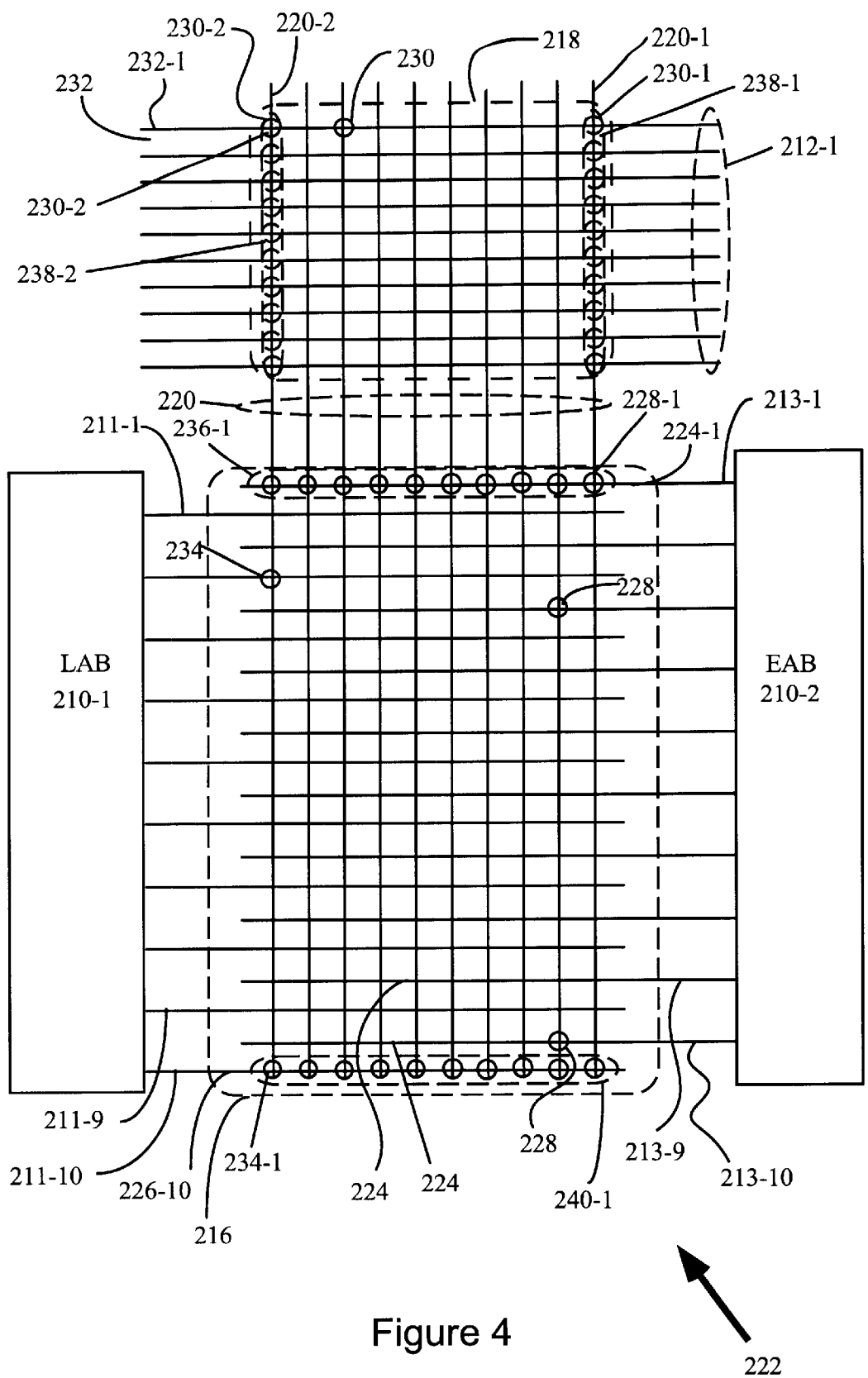
FIG. 4 is a schematic diagram of a representative portion of the complex programmable logic device as shown in FIG. 3.

FIG. 4 illustrates a schematic diagram of a representative portion 222 of the CPLD 200 as shown in FIG. 3. The representative portion 222 has the global horizontal conductor 212-1 coupled to the EAB 210-2 by way of the local vertical conductors 220 and EAB interleaved horizontal conductors 224. The EAB interleaved horizontal conductors 224 are included in the shared programmable interconnect region 216. The local vertical conductors 220 are programmably coupled to the global horizontal conductor 212-1 by way of the programmable interconnect array 218. The local vertical conductors 220 are also programmably coupled to the EAB interleaved horizontal conductors 224 by way of the shared programmable interconnect region 216. The EAB interleaved horizontal conductors 224 in turn couple to the EAB I/O lines 213 of the EAB 210-2.

The representative portion 222 also has the global horizontal conductor 212-1 coupled to LAB 210-1 by way of the local vertical conductors 220 and LAB interleaved local horizontal conductors 226. The representative portion 222 has the global horizontal conductor 212-1 coupled to the LAB 210-1 by way of the local vertical conductors 220 and LAB interleaved horizontal conductors 226. The LAB interleaved horizontal conductors 226 are also included in the shared programmable interconnect region 216. The local vertical conductors 220 are also programmably coupled to the LAB interleaved horizontal conductors 226 by way of the shared programmable interconnect region 216. The LAB interleaved horizontal conductors 226 in turn couple to the LAB I/O lines 211 of the LAB 210-1.

The shared programmable interconnect region 216 includes a group of programmable connectors 228 associated with the EAB interleaved local horizontal conductors 224. The group of programmable connectors 228 operate to selectively connect the EAB interleaved local horizontal conductors 224 to the local vertical conductors 220. The programmable interconnect array 218 includes a group of programmable connectors 230 associated with the local vertical conductors 220. The group of programmable connectors 230 operate to selectively connect the local vertical conductors 220 to row channels 232 included in the global horizontal conductor 212-1. The shared programmable interconnect region 216 also includes a group of programmable connectors 234 associated with the LAB interleaved local horizontal conductors 226. The group of programmable connectors 234 operate to selectively connect the LAB interleaved local horizontal conductors 226 to the shared local vertical conductors 220. Although the shared programmable interconnect region 216 and the programmable interconnect array 218 are normally fully populated with programmable connectors at all intersections of conductors (see FIG. 2), for ease of illustration only, a few representative programmable connectors (228,230,234) are illustrated in FIG. 4.

In order to fit a logic and/or a logic-memory function any place and route software can require selected ones of the programmable connectors 228 and the programmable connectors 230 to connect the EAB I/O lines 213 of the EAB 210-2 to the row channels 232 using the EAB interleaved local horizontal conductors 224 and the local vertical conductors 220. In a similar manner, the place and route software can also require selected ones of the programmable connectors 234 and the programmable connectors 230 to connect the LAB I/O lines 211 of the LAB 210-1 to the row channels 232 using the LAB interleaved local horizontal conductors 226 and the local vertical conductors 220.

For example, the EAB I/O line 213-1 can be connected to the selected EAB interleaved local horizontal conductor 224-1 having an associated group of programmable connectors 236-1 within the shared programmable interconnect region 216. The place and route software can then direct the programmable connector 228-1 included in the group of programmable connectors 236-1 to connect the EAB interleaved local horizontal conductor 224-1 to the local vertical conductor 220-1. Within the programmable interconnect array 218, the local vertical conductor 220-1 has an associated group of programmable connectors 238-1. The place and route software can further direct the selected programmable connector 230-1 included in the group of programmable connectors 238-1 to connect the shared local vertical conductor 220-1 to the row channel 232-1. In this manner, the EAB 210-2 can communicate with row channel 232-1 included in the global horizontal conductor 212-1 as well as with any internal or external circuitry connected thereto.

In a similar manner, the LAB I/O line 211-10 can connect to the selected LAB interleaved local horizontal conductor 226-10 having an associated group of programmable connectors 240-1 within the shared programmable interconnect region 216. The place and route software can then direct a programmable connector 234-1 included in the group of programmable connectors 240-1 to connect the LAB interleaved local horizontal conductor 226-10 to the local vertical conductor 220-2. Within the programmable interconnect array 218, the local vertical conductor 220-2 has an associated group of programmable connectors 238-2. The place and route software can further direct the selected programmable connector 230-2 included in the group of programmable connectors 238-2 to connect the local vertical conductor 220-2 to the row channel 232-1. In this manner, the LAB 210-1 can communicate with row channel 232-1 included in the global horizontal conductor 212-1 as well as with any internal or external circuitry connected thereto.

The sharing of the shared programmable interconnect region 216 reduces the quantity of programmable connectors 230 needed in the programmable interconnect array 218 as compared to the quantity required on to fit a logic function from conventional CPLD architectures. The quantity of programmable connectors 230 is reduced because a quantity L of shared local vertical conductors 220 is reduced. More specifically, the programmable interconnect array 218 in effect operates to reduce the total quantity of shared local vertical conductors 220 needed to fit a desired logic function. The place and route software can decide when to utilize the shared interconnect regions (areas) and thus reduce the quantity of local conductors supplied to the associated function blocks. For example, it will often be desirable to share an interconnect region (area) and its local vertical conductors between a pair of functions, where one function block is programmed to perform complex functions and the other function block is programmed to perform simple functions or, in some cases, no functions(i.e., unprogrammed).

By way of example a logic function can be fitted in the CPLD 200 by programming the EAB 210-2 to perform a memory function which requires a quantity n, for example, of the group of EAB I/O lines 213 to be connected to the row channels 232. The place and route software then can determine that the LAB 210-1 can be programmed to perform a logic function which only requires the quantity (L-n) of the group of local vertical conductors 220 to connect the row channels 232 to the group of LAB I/O lines 211. In this manner, the quantity L of local vertical conductors 220 included in the programmable interconnect array 218 can be less than the sum of (M+R) vertical conductors used to interconnect similar unassociated function blocks in conventional CPLD architectures where M is the quantity of local horizontal conductors associated with LABs and R is the quantity of local horizontal conductors associated with EABs. In addition, if desirable, the quantity of interface arrays 218 included in the CPLD 200 can also be reduced to a quantity Π equal to $(\mu_1+\mu_2)/m$, where "m" is the average number of function blocks 210 sharing a single programmable interface array 218. Further, by reducing the quantity L of vertical conductors 220 and the quantity Π of programmable interface arrays 218 included in the CPLD 200, a quantity ΔT of memory cells 162 can be removed from the CPLD 200 and still assure a high probability of fitting a desired logic function and/or a logic/memory function in the CPLD 200. In the described embodiment, the quantity ΔT can be determined by the following equation, $$\Delta T = N \times [\{(\mu_1 \times M) + (\mu_2 \times R) - \Pi\} \times L].$$

Using the FLEX10K100 type complex programmable logic device included in the FLEX10K family of programmable logic devices referenced above as an illustrative example, Table 1 characterizes possible distribution of programmable resources in the CPLD. Note in this illustrative example, the invention yields a savings of 18,000 memory cells and 89% reduction in programmable interface arrays.

TABLE 1

FLEX 10K100

| | Conventional CPLD | Inventive CPLD |
|---|---|---|
| Number of LABs ($\mu_1$) | 80 | 80 |
| Number of LAB I/Os (M) | 40 | 40 |
| Number of EABs ($\mu_2$) | 10 | 10 |
| Number of EAB I/Os (R) | 40 | 40 |
| Number of row channels (N) | 144 | 144 |
| Number of EAB PIAs | 10 | 0 |
| Number of LAB PIAs | 80 | 70 |
| Number of shared PIAs | 0 | 10 ($\pi$ = 8/9) |
| Number of programmable connectors | 518,400 | 504,000 ($\Delta T$ = 18,000) |

Figure 5:
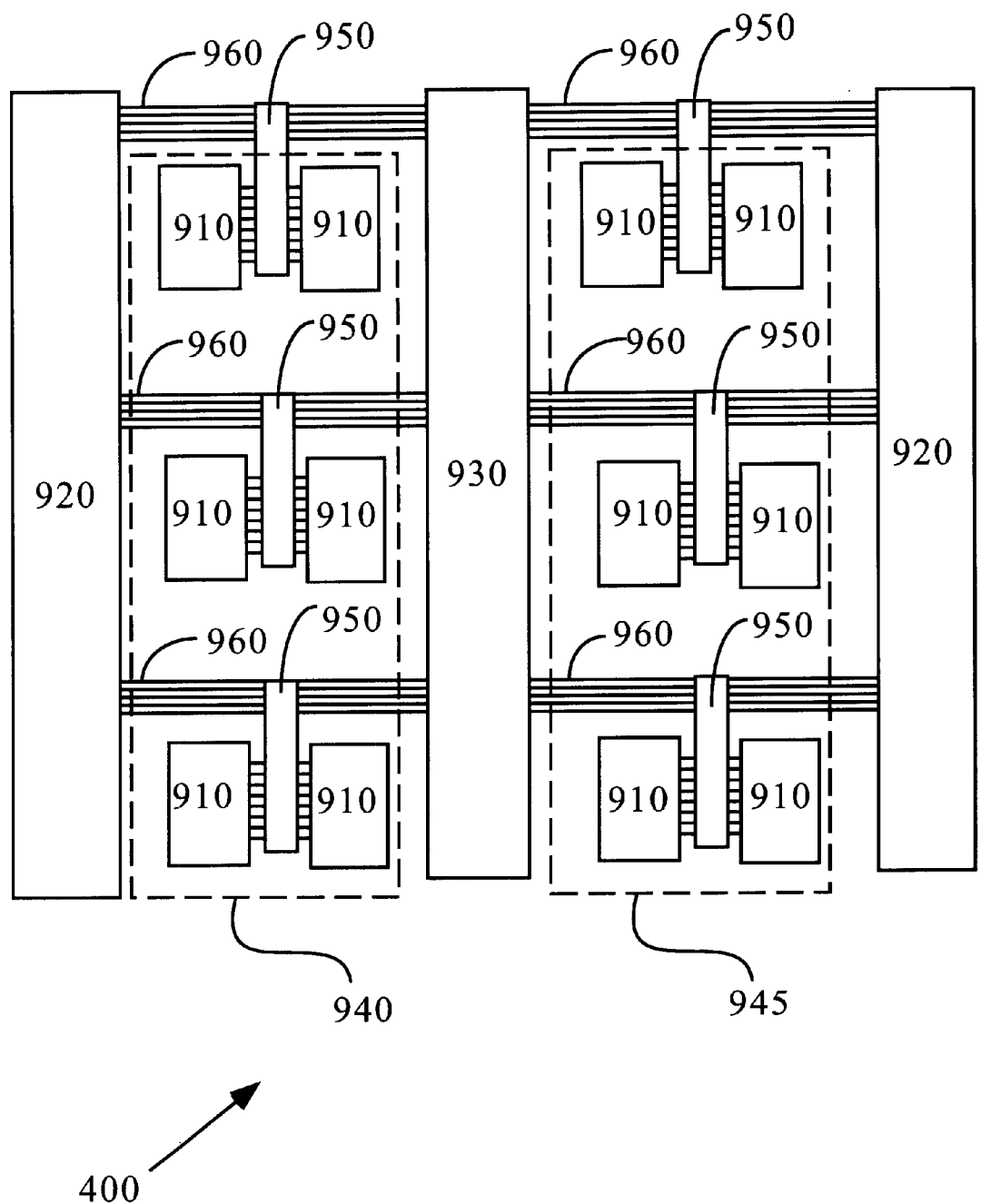
FIG. 5 is a block diagram of a complex programmable logic device architecture having an interconnect region capable of dynamically sharing signal lines amongst function blocks in accordance with another embodiment of the invention.

FIG. 5 represents another CPLD architecture 400 which includes a PLD I/O block 920 bi-directionally coupled by way of interconnection lines 960 to functional blocks 910 interconnected by way of associated programmable interconnect region (array) 950. An interconnection line switching matrix 930 connects a supergroup 940 of functional blocks 910 to a supergroup 945 of function blocks 910 to form an array of programmable function blocks. In the described embodiment, the PLD I/O block 920 can be connected to any suitable external circuitry.

Several advantages to using the shared programmable interface array stem from the invention. One advantage is the increased routability that results due to the more efficient use of a limited number of memory cells. By using less die area for the placement of memory resources, the available die area for the inclusion of additional routing and/or memory and logic elements is increased. Another advantage is that the risk of fitting a logic function with unacceptable performance problems caused by circuitous routing is substantially reduced since the EABs and the LABs are located in closer physical proximity than would be available in conventional CPLD architectures. Consequently, the increased flexibility enables the CPLD to fit more complex logic functions more often than possible with conventional CPLD architectures.

Although the foregoing invention has been described in some detail for purposes of clarity of understanding, it will be apparent that certain changes and modifications may be practiced within the scope of the appended claims. It should be noted that there are many alternative ways of implementing the present invention. It is therefore intended that the following appended claims be interpreted as including all such alterations, permutations, and equivalents as fall within the spirit and scope of the present invention.

What is claimed is:

1. An integrated circuit, comprising:

a plurality of horizontal interconnect lines;

a plurality of vertical interconnect lines;

a first type function block capable of being programmed in a first programming state to operate in a first plurality of modes, said first type function block includes a physical quantity of M function block Input/Output (I/O) lines, wherein when said first programming state corresponds to the first function block being fully programmed, each of said physical quantity of M function block I/O lines is programmably coupled to an associated one of said plurality of the vertical interconnect lines and wherein when said first programming state corresponds to the first function block being less than fully programmed, then each of a physical quantity of N function block I/O lines is programmably coupled to an associated one of said vertical interconnect lines where the quantity N is less than the quantity M;

a second type function block capable of being programmed in a second programming state to operate in a second plurality of modes, said second type function block includes a physical quantity of R function block Input/Output (I/O) lines, wherein when said second programming state corresponds to the second function block being fully programmed, each of said physical quantity of R function block I/O lines is programmably coupled to an associated one of said plurality of the vertical interconnect lines and wherein when said second programming state corresponds to the second function block being less than fully programmed, then each of a physical quantity of S function block I/O lines is programmably coupled to an associated one of said vertical interconnect lines where the quantity S is less than the quantity R; and a shared programmable interface array device having a reduced physical quantity of T vertical interconnects, wherein the reduced quantity T vertical interconnects is less than a sum of the quantity R and the quantity M, such that a routing and placing program fits a logic function by operatively connecting said first and said second function block to said horizontal interconnects based upon the respective programming states of said first function block and said second function block such that said plurality of vertical interconnects is reduced to no more than the quantity of T vertical interconnects included in said shared programmable interface device.

2. An integrated circuit as recited in claim 1, wherein by sharing said shared programmable interface array device between said first and second type function blocks, die area utilization on said integrated circuit to service the function block I/O lines of said first and second type function blocks is reduced.

3. An integrated circuit as recited in claim 1, wherein said shared programmable interface array device programmably interconnects said reduced quantity of T vertical interconnect lines to the function block I/O lines of said first and second type function blocks based upon the programming states of the first and the second type function blocks using an associated commensurably reduced quantity of programming resources.

4. An integrated circuit as recited in claim 3, wherein the programming resources are programmed memory cells that control the programmable interconnections provided by said shared programmable interface array device.

5. An integrated circuit as recited in claim 1, wherein said integrated circuit is a programmable logic device.

6. An integrated circuit as recited in claim 5, wherein said first type function block is a logic array block and said second type function block is an embedded array block.

7. An integrated circuit as recited in claim 1, wherein by sharing said vertical interconnects so as to provide connection of said horizontal interconnect lines to either said first type function block or said second type function block, the quantity of said shared vertical interconnects is able to be reduced without significant loss of programming flexibility.

* * * * *